US 6,856,547 B2

(12) United States Patent
Poidomani et al.

(10) Patent No.: US 6,856,547 B2
(45) Date of Patent: Feb. 15, 2005

(54) CIRCUIT FOR BIASING AN INPUT NODE OF A SENSE AMPLIFIER WITH A PRE-CHARGE STAGE

(75) Inventors: Carla Poidomani, Cassina De' Pecchi (IT); Emanuele Confalonieri, Milan (IT); Marco Sforzin, Cantu' (IT); Nicola Del Gatto, Torre Del Greco (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/664,606

(22) Filed: Sep. 16, 2003

(65) Prior Publication Data

US 2004/0125670 A1 Jul. 1, 2004

(30) Foreign Application Priority Data

Sep. 17, 2002 (EP) .......................................... 02425562

(51) Int. Cl.[7] ............................................... G11C 16/06
(52) U.S. Cl. ................................. 365/185.21; 365/207
(58) Field of Search ....................... 365/185.21, 189.07, 365/189.09, 189.11, 207, 233.5

(56) References Cited

U.S. PATENT DOCUMENTS

| 4,843,594 | A | | 6/1989 | Tanaka et al. ............. 365/185 |
| 5,197,028 | A | | 3/1993 | Nakai ......................... 365/185 |
| 6,219,290 | B1 | * | 4/2001 | Chang et al. ............... 365/207 |
| 6,236,603 | B1 | | 5/2001 | Cleveland .................. 365/203 |
| 6,307,797 | B1 | | 10/2001 | Fournel et al. ............. 365/203 |
| 6,320,790 | B1 | | 11/2001 | Micheloni ................ 365/185.2 |
| 6,424,571 | B1 | * | 7/2002 | Pekny .................... 365/185.21 |

* cited by examiner

*Primary Examiner*—Gene N. Auduong
(74) *Attorney, Agent, or Firm*—Lisa K. Jorgenson; Robert Iannucci; Seed IP Law Group PLLC

(57) ABSTRACT

A circuit for biasing an input node of a sense amplifier is proposed. The circuit includes a voltage regulator for keeping the input node at a pre-set operative voltage during a sensing operation. The circuit further includes a pulling device for pulling the input node from a starting voltage towards a power supply voltage, the operative voltage being comprised between the starting voltage and the power supply voltage. The circuit also includes a control device for disabling the pulling device before the input node reaches the operative voltage.

20 Claims, 2 Drawing Sheets

CIRCUIT FOR BIASING AN INPUT NODE OF A SENSE AMPLIFIER WITH A PRE-CHARGE STAGE

BACKGROUND OF THE INVENTION

1. Field of the Invention

The present invention relates to a circuit for biasing an input node of a sense amplifier.

2. Description of the Related Art

Sense amplifiers are commonly used in several applications (such as for reading cells of a non-volatile memory device). A sense amplifier consists of a circuit that detects a low-level signal applied to an input terminal thereof; typically, the sense amplifier compares the input signal with a reference signal, and outputs two different values according to the result of the comparison.

Operation of the sense amplifier requires that its input terminal be kept at a pre-set voltage. For example, in a non-volatile memory device (wherein each memory cell consists of a floating gate MOS transistor) the sense amplifier provides the correct biasing of the drain terminal of a selected memory cell to be read. The biasing voltage is set to a value (such as 1 V), which is a compromise between the opposed requirements of having a low biasing voltage (for avoiding any undesired writing of the selected memory cell) and a high biasing voltage (for having the input signal at a level sufficient to enable the reading operation).

Correct and accurate biasing of the drain terminal of the selected memory cell is of the utmost importance. In fact, any increase of the biasing voltage may result in the spurious writing of wrong values in the memory device; on the other end, any decrease of the biasing voltage may result in the reading of wrong values.

This problem has been exacerbated in the last years by the use of technological processes that have brought about a substantial reduction in the gain of the transistors implementing the memory cells. Moreover, the problem is particular acute in multilevel memory devices, wherein the distance between the distributions of the input signal associated with two adjacent values stored in each memory cell is strongly reduced (especially when a very low power supply voltage is used).

In order to keep the input node at the desired biasing voltage with a high degree of accuracy, most of the sense amplifiers known in the art include a voltage regulator; typically, the voltage regulator consists of a transistor in a cascode configuration that is controlled by a feedback inverter.

Document U.S. Pat. No. 6,320,790, which is assigned to the assignee of the present application and is incorporated by reference herein in its entirety, also proposes the use of a constant current generator for biasing the feedback inverter; the generator provides a current that is independent of the temperature and of the power supply voltage. This solution reduces the spread of the threshold voltage of the inverter, thereby increasing the accuracy of the feedback control on the voltage at the input node.

However, the high accuracy of the structures described above adversely affects the dynamic response of the sense amplifier, and then the performance of the whole memory device. Moreover, this drawback prevents the solutions known in the art to be used in high performance devices (for example, with an access time lower than a few tens of ns).

BRIEF SUMMARY OF THE INVENTION

An embodiment of the present invention overcomes the above-mentioned drawbacks.

Briefly, an embodiment of the present invention provides a circuit for biasing an input node of a sense amplifier including means for keeping the input node at a pre-set operative voltage during a sensing operation, means for pulling the input node from a starting voltage towards a power supply voltage, the operative voltage being comprised between the starting voltage and the power supply voltage, and control means for disabling the means for pulling before the input node reaches the operative voltage.

Moreover, embodiments of the present invention provides a sense amplifier including this circuit, and a non-volatile memory device including the sense amplifier; a corresponding method of biasing an input node of a sense amplifier is also encompassed.

BRIEF DESCRIPTION OF THE SEVERAL VIEWS OF THE DRAWINGS

Further features and the advantages of the solution according to the present invention will be made clear by the following description of a preferred embodiment thereof, given purely by way of a non-restrictive indication, with reference to the attached figures, in which.

DETAILED DESCRIPTION OF THE INVENTION

Figure 1:
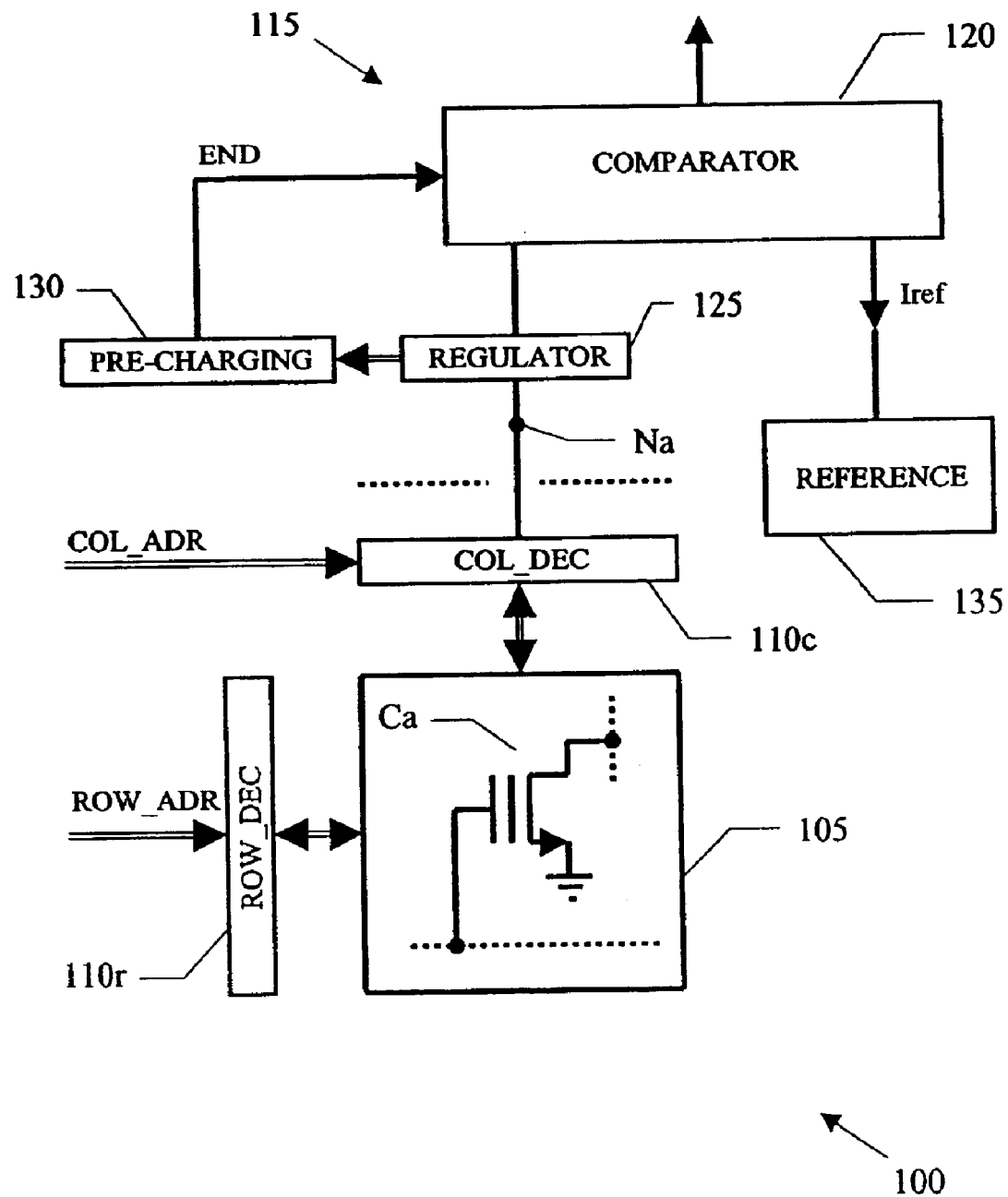
FIG. 1 is a schematic block diagram of a reading section of a non-volatile memory device in which the circuit of the invention can be used.

Referring in particular to FIG. 1, a reading section of a memory device 100 (such as a flash E2PROM) is illustrated. The memory device 100 is fed by a power supply voltage +Vdd of low value, such as 1.8 V (with respect to a reference voltage, or ground). The memory device 100 includes an array 105 of memory cells Ca, each one consisting of a floating gate MOS transistor. The memory cell Ca in a non-programmed (or erased) condition features a low threshold voltage (associated with a logic value 1). The memory cell Ca is programmed by injecting electric charges into its floating gate; in this condition, the memory cell Ca features a high threshold voltage (associated with a logic value 0).

The array 105 has a so-called NOR architecture. The source terminals of all the memory cells Ca are connected to a common source line (typically kept at ground); the control gate terminals of the memory cells Ca of each row are connected to a corresponding word line. The drain terminals of the memory cells Ca of each column are connected to a corresponding bit line; the bit lines are grouped into packets (such as 16), each one for a bit of a word that is simultaneously processed by the memory device 100.

A column decoder (COL_DEC) 110c is used to select the bit lines of a word, in response to a column address COL_ADR; a row decoder (ROW_DEC) 110r is likewise used to select a word line, in response to a row address ROW_ADR. The column decoder 110c is connected to a reading unit, which outputs a word read from the array 105 (defined by the values stored in the selected memory cells Ca).

The reading unit includes a sense amplifier 115 for each bit of the word (16 in the example at issue). The sense amplifier 115 has an array leg and a reference leg, which are connected to respective input terminals of a current comparator 120. An output terminal of the comparator 120 provides a bit of a word read from the matrix 105.

As described in detail in the following, the array leg includes a voltage regulator 125, to which a pre-charging stage 130 is coupled. The voltage regulator 125 is interposed between the corresponding input terminal of the comparator 120 and an array node Na; the array node Na defines an input of the sense amplifier 115, which is connected to the selected bit line through the column decoder 110c. The pre-charging stage 130 outputs a signal END indicative of the completion of a pre-charging phase of the array node Na; the completion signal END is applied to an enabling terminal of the comparator 120.

The reference leg includes a block 135 embedding a reference cell; the reference cell consists of a floating gate MOS transistor in a condition intermediate between the non-programmed condition and the programmed condition. The reference cell is biased so as to provide a reference current Iref.

During a reading operation, the bit line selected by the column decoder 110c is connected to the array node Na (while the other bit lines are left floating). The sense amplifier 115 biases the selected bit line to a pre-set reading voltage (for example, 1 V). At the same time, the word line selected by the row decoder 110r is brought to the power supply voltage +Vdd (while the other word lines are kept at ground). As a consequence, all the memory cells Ca of the selected bit line (save for the one belonging to the selected word line) are always non-conductive.

When the selected memory cell Ca is not programmed, a current higher than Iref flows through the corresponding bit line; as a consequence, the voltage at the output terminal of the comparator 120 is high (logic value 1). Conversely, when the selected memory cell Ca is programmed, no current flows through the corresponding bit line; in this case, the voltage at the output terminal of the comparator 120 is low (logic value 0).

The concepts exposed in the foregoing are readily extended to a multilevel memory device. In this case, the memory cells may be programmed to multiple levels, each one associated with a corresponding range of their threshold voltages. Each level represents a different logic value. Typically, the number of levels is a power of 2; therefore, a memory cell with L=2BN levels stores a logic value consisting of BN bits of information. Each pair of adjacent logic values is discriminated by a corresponding reading reference voltage. In this case, a different reference cell (with an associated sense amplifier) is required for every level of each memory cell of the word.

Similar considerations apply if the memory device has another architecture, if the memory device includes a different number of sense amplifiers (down to a single one), if the sense amplifier has another structure, if the multilevel memory device includes a single sense amplifier for each memory cell of the word (with the selected memory cell that is compared with different reference cells in sequence), and the like. Alternatively, the completion signal is used to enable specific portions of the comparator, or it is provided to one or more different circuits of the sense amplifier.

Figure 2:
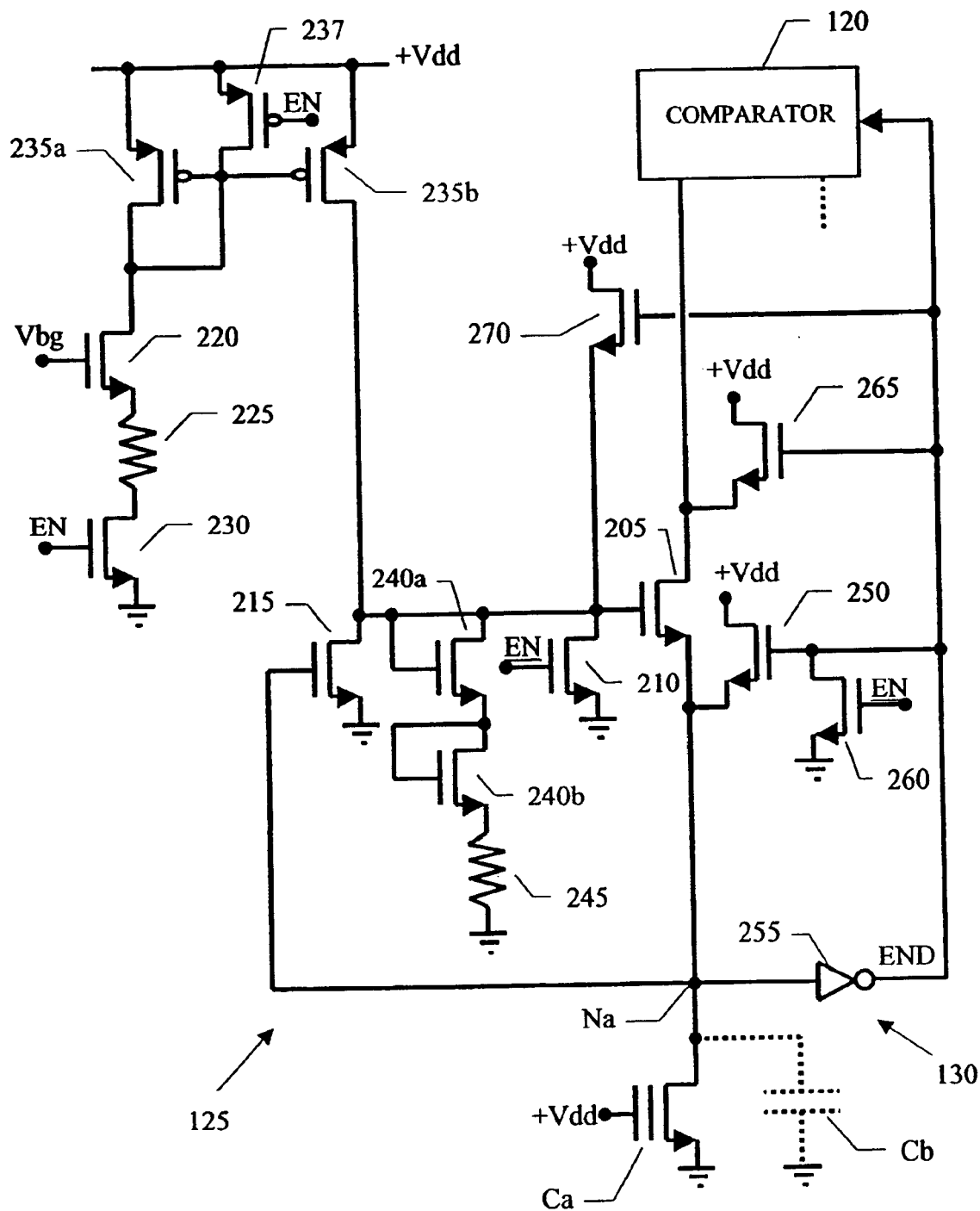
FIG. 2 shows the circuit in a simplified representation.

Considering now FIG. 2, the selected memory cell Ca is shown as being directly connected to the array node Na (omitting the column decoder for the sake of simplicity); the total capacitance (of the order of some tens of pF) of the other memory cells belonging to the selected bit line is schematically represented by an equivalent capacitor Cb (shown in dashed lines between the array node Na and a ground terminal).

The voltage regulator 125 is formed by an NMOS transistor 205 in a cascode configuration (so as to decouple the array node Na from the comparator 120). The transistor 205 has the source terminal connected to the array node Na and the drain terminal connected to the corresponding input terminal of the comparator 120. Operation of the transistor 205 is enabled by a further NMOS transistor 210. The transistor 210 has the source terminal connected to the ground terminal and the drain terminal connected to the gate terminal of the transistor 205; a signal EN (generated inverting an enabling signal EN) is applied to the gate terminal of the transistor 210.

The transistor 205 is controlled in feedback by an inverter coupled to the array node Na. The inverter includes an NMOS transistor 215 with the gate terminal connected to the array node Na; the transistor 215 has the source terminal connected to the ground terminal and the drain terminal connected to the gate terminal of the transistor 205.

The transistor 215 is biased by a current generator, which supplies a current that is substantially independent of the temperature and of the power supply voltage +Vdd. In detail, the current generator includes an NMOS transistor 220 receiving a reference voltage Vbg (for example, generated by a band gap circuit) at its gate terminal. The source terminal of the transistor 220 is connected, through a resistor 225, to the drain terminal of a further NMOS transistor 230. The transistor 230 has the source terminal connected to the ground terminal and receives the enabling signal EN at its gate terminal. A current mirror consisting of two PMOS transistors 235a and 235b is interposed between the transistor 220 and the transistor 215. Particularly, the drain terminal of the transistor 235a is connected to the drain terminal of the transistor 220, and the drain terminal of the transistor 235b is connected to the drain terminal of the transistor 215. Both transistors 235a and 235b have the source terminals connected to a power supply terminal (+Vdd); the gate terminal of the transistor 235a is short circuited to its drain terminal and to the gate terminal of the transistor 235b. Operation of the current generator described above is enabled by a PMOS transistor 237, which receives the enabling signal EN at its gate terminal; the transistor 237 has the source terminal connected to the power supply terminal and the drain terminal connected to the gate terminals of the transistors 235a,235b.

A filtering circuit is further connected to the gate terminal of the transistor 205. The filtering circuit is formed by two NMOS transistors 240a and 204b in a diode configuration. The transistor 240a has the drain terminal and the gate terminal connected to the gate terminal of the transistor 205; the source terminal of the transistor 240a is connected to the drain terminal and to the gate terminal of the transistor 240b. A resistor 245 is connected between the source terminal of the transistor 240b and the ground terminal. The resistor 245 has a resistance that increases with the temperature; for example, the resistor 245 is made in an N-well of a chip wherein the whole memory device is integrated.

The pre-charging stage 130 is formed by a pull-up NMOS transistor 250, which is controlled in feedback by an inverter 255 coupled to the array node Na. Particularly, the transistor 250 has the drain terminal connected to the power supply terminal and the source terminal connected to the array node Na. The inverter 255 has the input terminal connected to the array node Na and the output terminal connected to the gate terminal of the transistor 250. The inverter 255 has a threshold voltage (for example, 0.8 V) that is lower than the reading voltage (1 V). The inverter 255 outputs the signal END, which is asserted as soon as the voltage at the array node Na reaches the threshold voltage of the inverter 255. The signal END is applied to the gate terminal of the transistor 250 (in addition to be provided to the comparator 120). Operation of the pull-up transistor 250 is enabled by a further NMOS transistor 260, which receives the inverted enabling signal EN at its gate terminal; the transistor 260 has the drain terminal connected to the gate terminal of the transistor 250 and the source terminal connected to the ground terminal.

The signal END is also supplied to the gate terminals of two further pull-up NMOS transistors 265 and 270. Particularly, the transistor 265 has the drain terminal connected to the power supply terminal and the source terminal connected to the drain terminal of the transistor 205. Likewise, the transistor 270 has the drain terminal connected to the power supply terminal and the source terminal connected to the gate terminal of the transistor 205.

In a stand-by condition of the sense amplifier, the enabling signal EN is at low voltage (0 V) and the inverted enabling signal EN is at high voltage (+Vdd). In this case, the transistor 230 is switched off and the transistors 210, 240 and 260 are switched on, in order to reduce the power consumption of the sense amplifier. During operation of the sense amplifier, the enabling signal EN is brought to high voltage and the inverted enabling signal EN is brought to low voltage; as a consequence, the transistor 230 is switched on and the transistors 210, 240 and 260 are switched off (so as not to interfere with operation of the sense amplifier).

At the beginning of each reading operation, the selected bit line is typically at ground. Therefore, when the selected bit line is connected to the array node Na (through the column decoder) the output terminal of the inverter 255 is brought to high voltage, so as to switch on the transistor 250. In this way, the transistor 250 short-circuits the array node Na to the power supply terminal. As a result, the capacitor Cb is charged towards the power supply voltage +Vdd, thereby increasing the voltage at the array node Na very fast. At the same time, the inverter 255 also switches on the transistors 265 and 270. As a consequence, the voltage at the drain terminal and the voltage at the gate terminal of the transistor 205 likewise increases very fast.

As soon as the voltage at the array node Na reaches the threshold voltage of the inverter 255 (0.8 V), the output terminal of the inverter 255 is brought to low voltage. As a consequence, the transistors 250, 265 and 270 are switched off (so as not to interfere with operation of the sense amplifier).

The array node Na is then driven to the desired reading voltage (1 V) through the transistor 205. Moreover, the transistor 215 controls the transistor 205 so as to keep the voltage at the array node Na at its correct value; particularly, when the voltage at the array node Na increases the voltage at the gate terminal of the transistor 205 decreases (thereby reducing its conductivity), whereas when the voltage at the array node Na decreases the voltage at the gate terminal of the transistor 205 increases.

The filtering circuit 240a, 240b, 245 avoids any overshooting at the gate terminal of the transistor 205 (and then also at the array node Na). In addition, the circuit 240a, 240b, 245 also operates as a clipper, which immediately reduces the voltage at the gate terminal of the transistor 205 (and then also its conductivity) should the voltage at the array node Na increase excessively (before the slower intervention of the inverter formed by the transistor 215). The two diodes 240a,240b provides a threshold voltage that is sufficiently high to avoid any undesired intervention of the circuit 240a, 240b, 245.

The transistor 205 and each diode 240a,240b have a threshold voltage that decreases with the temperature in a similar manner; therefore, any change (due to the temperature) in the total threshold voltage of the two diodes 240a,240b is always twice the corresponding change in the threshold voltage of the transistor 205. However, the resistance of the resistor 245 increases with the temperature; in this way, any change in the threshold voltage of the whole circuit 240a, 240b, 245 is comparable to the one in the threshold voltage of the transistor 205. As a consequence, the circuit 240a, 240b, 245 may be dimensioned to work correctly at low temperature, without adversely affecting operation of the voltage regulator at high temperature.

Similar considerations apply if equivalent circuits are used (for example, without any enabling transistors), if the inverter in the voltage regulator is formed with two complementary transistors, if the current generator is implemented in another way, if the diodes and/or the resistor of the filtering circuit have a different structure, if the NMOS and PMOS transistors are replaced with equivalent components, and the like. Alternatively, a NOR gate (controlled by the enabling signal) is provided instead of the inverter in the voltage regulator, or a further transistor (controlled by the power supply voltage) is connected in series to the inverter in the voltage regulator (so as to remove any residual dependency on the temperature or on the power supply voltage).

More generally, an embodiment of the present invention proposes a circuit for biasing an input node of a sense amplifier. The biasing circuit includes means for keeping the input node at a pre-set operative voltage during a sensing operation. The biasing circuit of the invention further includes means that pulls the input node from a starting voltage towards a power supply voltage (with the operative voltage that is comprised between the starting voltage and the power supply voltage); control means is used to disable the means for pulling the input node before the input node reaches the operative voltage.

The embodiment strongly improves the dynamic response of the sense amplifier (and then the operative speed of any device wherein the sense amplifier is used). This result is achieved without affecting the correct and accurate biasing of the input node of the sense amplifier during the reading operation.

Therefore, the devised solution provides a sense amplifier featuring high performance and good reliability at the same time.

This is very important when the sense amplifier is used in high performance devices (for example, memory devices with a very low access time), and particularly in memory devices of the multilevel type (even if different applications are not excluded).

The preferred embodiment of the invention described above offers further advantages.

Particularly, the pull-up transistor is controlled in feedback by a completion signal, which is generated according to the voltage at the array node.

In this way, the advantages of the proposed solution are achieved with a circuit that is self-controlled, and does not require any external signal.

Preferably, the sense amplifier includes a voltage regulator having a transistor in a cascode configuration; the cascode transistor is controlled by a feedback inverter, which is biased by a current generator.

This structure exploits the solution of the invention at its best.

As a further improvement, a filtering circuit is connected to the gate terminal of the cascode transistor.

The proposed circuit strongly reduces any overshooting at the array node.

Advantageously, the filtering circuit includes two or more diodes and a resistor (for self-compensating any change with the temperature).

This structure provides a sufficiently high threshold voltage for the intervention of the filtering circuit, and at the same time reduces the different behavior of the cascode transistor and the filtering circuit with the temperature.

Alternatively, a different circuit is used for disabling the pull-up transistor (even without any feedback control), the sense amplifier has another structure, an equivalent filtering circuit is exploited (for example, with a different number of diodes, down to a single one, and even without any resistor), and the like. Moreover, the solution of the invention leads itself to be implemented without any filtering circuit; vice versa, the filtering circuit is suitable to be used even without the pre-charging stage described above.

A way to further improve the proposed solution is to use the completion signal for controlling additional pull-up transistors; for example, two more pull-up transistors are connected to the drain terminal and to the gate terminal, respectively, of the cascode transistor.

In this way, the dynamic response of other nodes of the sense amplifier is improved (exploiting a signal already available).

Preferably, the pre-charging circuit is implemented with one or more pull-up transistors, which are controlled by an inverter having a threshold voltage lower than the reading voltage.

The proposed structure is quite simple, but at the same time effective. Moreover, this ensures that the pre-charging stage is always disabled during the reading operation.

However, the solution leads itself to be implemented replacing the pull-up transistors and/or the inverter with different components, using the completion signal in another way, or even without any additional pull-up transistors.

Preferably, the completion signal is also provided to other circuits of the sense amplifier.

In this way, for example, the other circuits may be enabled only when the pre-charging phase has been completed.

Typically, the sense amplifier including the biasing circuit of the present invention is used in a non-volatile memory device.

Particularly, the solution makes it possible to manufacture memory devices of the multilevel type, which work at an operative speed comparable to the one of the standard memory devices (even when a very low power supply voltage is used).

Alternatively, the completion signal is only used inside the biasing circuit, or different applications of the sense amplifier including the proposed biasing circuit are contemplated. For example, the sense amplifier is used in a memory device with cells storing a single bit, in an EPROM, or even in a different device (such as a sensor).

Naturally, in order to satisfy local and specific requirements, a person skilled in the art may apply to the solution described above many modifications and alterations all of which, however, are included within the scope of protection of the invention as defined by the following claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A circuit for biasing an input node of a sense amplifier, the circuit comprising:
    means for keeping the input node at a pre-set operative voltage during a sensing operation;
    means for pulling the input node from a starting voltage towards a power supply voltage, the operative voltage being comprised between the starting voltage and the power supply voltage; and
    control means for disabling the means for pulling before the input node reaches the operative voltage.

2. The circuit according to claim 1, wherein the control means are connected in feedback to the input node for generating a completion signal when a voltage at the input node reaches a threshold value comprised between the starting voltage and the operative voltage, the means for pulling being disabled in response to the completion signal.

3. The circuit according to claim 1, wherein the means for keeping the input node at the operative voltage includes a voltage regulator including:
    a cascode transistor having a control terminal, a first terminal and a second terminal, the first terminal being connected to the input node;
    a feedback inverter connected between the input node and the control terminal of the cascode transistor; and
    a current generator for supplying a biasing current to the feedback inverter, the biasing current being substantially independent of temperature and of the power supply voltage.

4. The circuit according to claim 3, wherein the voltage regulator further includes filtering means connected to the control terminal of the cascode transistor.

5. The circuit according to claim 4, wherein the filtering means includes a plurality of diodes and a resistor connected in series, each diode having a threshold voltage decreasing with the temperature and the resistor having a resistance increasing with the temperature.

6. The circuit according to claim 3, including further means for pulling the second terminal of the cascode transistor towards the power supply voltage, and still further means for pulling the control terminal of the cascode transistor towards the power supply voltage, the control means disabling the further means for pulling and the still further means for pulling before the input node reaches the operative voltage.

7. The circuit according to claim 6, wherein the control means includes a further feedback inverter having an input terminal connected to the input node and an output terminal providing the completion signal, the further feedback inverter having a threshold voltage lower than the operative voltage, and wherein each of the means for pulling, the further means for pulling and the still further means for pulling includes a corresponding pull-up transistor having a control terminal connected to the output terminal of the further feedback inverter.

8. A sense amplifier, comprising:
    an input node; and
    a circuit for biasing the input node, the circuit including:
    means for keeping the input node at a pre-set operative voltage during a sensing operation;
    means for pulling the input node from a starting voltage towards a power supply voltage, the operative voltage being comprised between the starting voltage and the power supply voltage; and control means for disabling the means for pulling before the input node reaches the operative voltage.

9. The sense amplifier according to claim 8, further including an additional circuit, coupled with the circuit for biasing the input node, for receiving the completion signal.

10. A non-volatile memory device, comprising:
a plurality of memory cells; and
a sense amplifier for reading the memory cells, the sense amplifier, including:
an input node; and
a circuit for biasing the input node, the circuit including:
means for keeping the input node at a pre-set operative voltage during a sensing operation;
means for pulling the input node from a starting voltage towards a power supply voltage, the operative voltage being comprised between the starting voltage and the power supply voltage; and
control means for disabling the means for pulling before the input node reaches the operative voltage.

11. A method of biasing an input node of a sense amplifier, the method comprising the steps of:
keeping the input node at a pre-set operative voltage during a sensing operation; and
pulling the input node from a starting voltage towards a power supply voltage by use of corresponding means, the operative voltage being comprised between the starting voltage and the power supply voltage; and
disabling the means for pulling before the input node reaches the operative voltage.

12. A sense amplifier for reading a memory cell, the sense amplifier comprising:
a comparator; and
a regulator transistor connected between an input of the comparator and an array node connected to the memory cell, the regulator transistor having a control terminal, a first conduction terminal connected to the comparator input, and a second conduction terminal connected to the array node;
a first bias transistor connected between a supply voltage and the array node; and
a control element connected between the array node and a control terminal of the first bias transistor, and structured to turn off the first bias transistor in response to a voltage of the array node achieving a threshold voltage.

13. The sense amplifier of claim 12 wherein the control element includes a feedback inverter connected between the array node and the control terminal of the first bias transistor.

14. The sense amplifier of claim 13 wherein the regulator transistor is structured to maintain the array node at a predetermined operating voltage during reading of the memory cell and the feedback inverter has a threshold voltage that is less than the operating voltage such that the first bias transistor is turned off before the array node achieves the operating voltage.

15. The sense amplifier of claim 12, further comprising:
a feedback inverter connected between the array node and the control terminal of the regulator transistor.

16. The sense amplifier of claim 15, further comprising a current generator for supplying a biasing current to the feedback inverter, the biasing current being substantially independent of temperature and of the supply voltage.

17. The sense amplifier of claim 12, further including a clipper circuit connected between the control terminal of the regulator transistor and a reference voltage, the clipper circuit being structured to limit a voltage of the control terminal of the regulator transistor.

18. The sense amplifier of claim 17, wherein the clipper circuit includes a plurality of diodes and a resistor connected in series between the control terminal of the regulator transistor and the reference voltage, each diode having a threshold voltage decreasing with the temperature and the resistor having a resistance increasing with the temperature.

19. The sense amplifier of claim 12, further comprising a second bias transistor connected between the supply voltage and the first conduction terminal of the regulator transistor, the second bias transistor having a control terminal connected to the control element which is structured to turn off the second bias transistor in response to the voltage of the array node achieving the threshold voltage.

20. The sense amplifier of claim 12, further comprising a second bias transistor connected between the supply voltage and the control terminal of the regulator transistor, the second bias transistor having a control terminal connected to the control element which is structured to turn off the second bias transistor in response to the voltage of the array node achieving the threshold voltage.

* * * * *